United States Patent [19]

Westwick

[11] Patent Number: 4,720,686
[45] Date of Patent: Jan. 19, 1988

[54] CIRCUIT FOR CONVERTING A FULLY DIFFERENTIAL AMPLIFIER TO A SINGLE-ENDED OUTPUT AMPLIFIER

[75] Inventor: Alan L. Westwick, Austin, Tex.

[73] Assignee: Motorola, Inc., Schaumburg, Ill.

[21] Appl. No.: 3,173

[22] Filed: Jan. 14, 1987

[51] Int. Cl.$^4$ ............................................. H03F 3/45
[52] U.S. Cl. .................................... 330/258; 330/301
[58] Field of Search ............... 330/147, 252, 258, 259, 330/301

[56] References Cited

U.S. PATENT DOCUMENTS 4,634,996  1/1987  Gulczynski ..................... 330/258 X

FOREIGN PATENT DOCUMENTS 2853829  7/1979  Fed. Rep. of Germany ...... 330/258

Primary Examiner—Eugene R. LaRoche
Assistant Examiner—Steven J. Mottola
Attorney, Agent, or Firm—John A. Fisher; Jeffrey Van Myers; Robert L. King

[57] ABSTRACT

A circuit which converts differential outputs of a fully differential amplifier to a single output using a buffer amplifier is provided. The fully differential amplifier has common-mode feedback provided by a differential feedback stage. An input of the common-mode differential feedback stage is connected to a predetermined one of the differential outputs to maintain the predetermined output at a reference voltage potential. The buffer amplifier uses diffused or well resistors and a single-ended differential amplifier. The buffer amplifier has a balanced structure which minimizes noise and resistor nonlinearity output errors. The circuit also maintains excellent power supply rejection.

9 Claims, 3 Drawing Figures

CIRCUIT FOR CONVERTING A FULLY DIFFERENTIAL AMPLIFIER TO A SINGLE-ENDED OUTPUT AMPLIFIER

TECHNICAL FIELD

This invention relates generally to differential amplifier circuits, and more particularly, to fully differential amplifiers which are converted to single output amplifiers.

BACKGROUND ART

Fully differential amplifiers have known advantages over a differential amplifier with a single output. Two of the most important advantages include improved power supply rejection and improved noise immunity. However, many practical applications require a single analog output and cannot use a differential output. Therefore, a conversion from differential outputs to a single-ended output must be made by an output stage coupled to a fully differential amplifier. Fully differential amplifiers also typically utilize common-mode feedback to regulate the common-mode output voltage of the amplifier. A common-mode feedback amplifier which develops a common-mode signal with a polysilicon resistor divider is typically used. Such a common-mode feedback amplifier is illustrated by De La Plaza and Morlon at page 916 in "Power-Supply Rejection in Differential Switched-Capacitor Filters" in the IEEE Journal of Solid-State Circuits, Vol. SC-19, No. 6, December 1984, pages 912-918. A disadvantage associated with using polysilicion resistors is associated with the fact that polysilicon resistors have low resistivity which limits the amount of resistive value. Therefore, an amplifier with polysilicon resistors must be specifically sized to drive a low impedance load. An alternative to using polysilicon resistors is to use a diffused or well resistor which can have a sheet resistance of two orders of magnitude higher sheet resistance than polysilicon resistors in most integrated circuit processes. Diffused resistors, however, have a resistance that changes with signal voltage, due to variation in width of the depletion region caused by reverse biasing of the junction which isolates the resistor from the semiconductor substrate. Yet another form of common-mode feedback amplifier for developing a common-mode signal uses balanced switched capacitors as taught by Senderowicz et al. at page 1020 in "A Family of Differential NMOS Analog Circuits for a PCM Codec Filter Chip" in the IEEE Journal of Solid-State Circuits, Vol. SC-17, No. 6, December 1982, pages 1014-1023. Typically, when fully differential amplifiers such as the ones mentioned above have been converted to single-ended output stages, a large amount of circuitry may be required and noise or power supply rejection performance may be degraded by the conversion.

BRIEF DESCRIPTION OF THE INVENTION

Accordingly, an object of the present invention is to provide an improved circuit for converting a fully differential amplifier to a single-ended output amplifier.

Another object of the present invention is to provide an improved single output differential amplifier structure with improved power supply rejection and noise immunity.

A further object of the present invention is to provide an improved circuit for converting a fully differential output to a single-ended output while minimizing distortion and circuit area.

In carrying out the above and other objects of the present invention, there is provided, in one form, a circuit for converting first and second outputs of a fully differential amplifier to a single output. A common-mode output voltage control portion is coupled to the fully differential amplifier for maintaining a predetermined output common-mode voltage. A first input of the common-mode control portion is connected directly to a predetermined one of the first or second outputs of the fully differential amplifier. A second input of the common-mode control portion is connected directly to a reference voltage terminal. An output buffer is coupled to the first and second outputs of the fully differential amplifier for providing the single output.

These and other objects, features and advantages will be more clearly understood from the following detailed description taken in conjunction with the accompanying drawings.

DETAILED DESCRIPTION OF THE INVENTION

Figure 1:
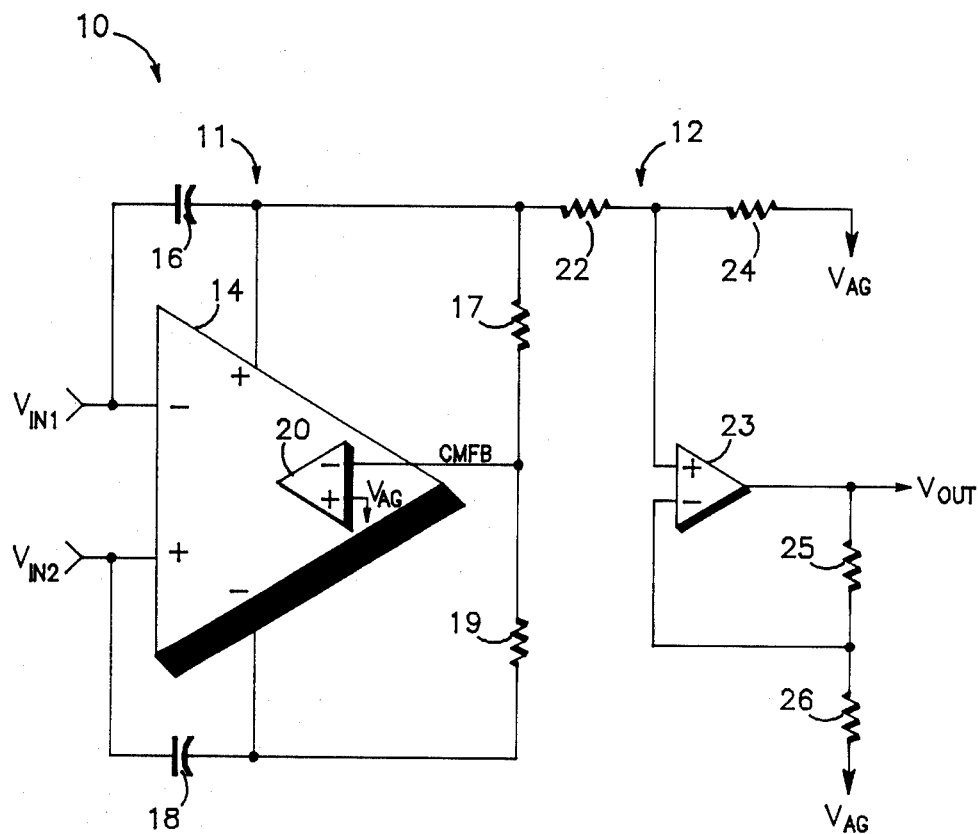
FIG. 1 illustrates in partial schematic diagram form, a circuit for converting differential amplifier outputs to a single output.

Shown in FIG. 1 is a circuit 10 having a fully differential amplifier portion 11 and a single-ended conversion portion 12 for providing a conversion from differential outputs to a single output. Differential amplifier portion 11 may be utilized in a variety of applications such as the last stage in a fully differential switched-capacitor filter network. Differential amplifier portion 11 has a fully differential amplifier 14 having positive and negative inputs and outputs. A first input voltage labeled "$V_{IN1}$" is connected to the negative input of differential amplifier 14 and to a first electrode of a feedback capacitor 16. A second electrode of capacitor 16 is connected to both the positive output of differential amplifier 14 and a first terminal of a common-mode feedback resistor 17. A second input voltage labeled "$V_{IN2}$" is connected to the positive input of differential amplifier 14 and to a first electrode of a feedback capacitor 18. A second electrode of feedback capacitor 18 is connected to both the negative output of differential amplifier 14 and to a first terminal of a common-mode feedback resistor 19. Second terminals of common-mode feedback resistors 17 and 19 are connected together and connected to a negative input of a feedback amplifier 20. A positive input of feedback amplifier 20 is connected to an analog ground reference labeled "$V_{AG}$". An output of feedback amplifier 20 controls the common-mode output voltage of both the positive and negative outputs of differential amplifier 14. Varying circuit structures may be used to implement feedback amplifier 20 and fully differential amplifier 14. Detailed information of a preferred implementation of fully differential amplifier 14 and common-mode feedback amplifier 20 is taught in my copending allowed U.S. patent application Ser. No. 06/851,046 illustrated at figure two therein.

Single-ended conversion portion 12 has a first terminal of a resistor 22 connected to the positive output of differential amplifier 14. A second terminal of resistor 22 is connected to both a positive input of a single-ended differential amplifier 23 and a first terminal of a resistor 24. A second terminal of resistor 24 is connected to analog ground $V_{AG}$. A resistor 25 has a first terminal connected to an output of differential amplifier 23 which provides an output voltage labeled "$V_{OUT}$". A second terminal of resistor 25 is connected to both a negative input of differential amplifier 23 and to a first terminal of a resistor 26. A second terminal of resistor 26 is connected to analog ground $V_{AG}$.

In operation, fully differential amplifier 14 provides positive and negative differential output voltages in response to the first and second input voltages. Common-mode feedback resistors 17 and 19 are typically equal valued resistors and function as a voltage divider to provide the common-mode feedback signal, CMFB. As a result of the common-mode resistive voltage divider, common-mode feedback amplifier 20 is able to maintain the output common-mode voltage about a predetermined reference value such as analog ground $V_{AG}$. Feedback capacitors 16 and 18 function in part to determine the voltage gain of differential amplifier 14. In some applications, feedback resistors or resistor equivalents may be used in lieu of feedback capacitors 16 and 18. It should be understood that for purposes of the present invention, any of several well known operational amplifier structures with resistive voltage divider common-mode feedback may be used to implement differential amplifier portion 11.

In the illustrated form, single-ended conversion portion 12 is connected to only one output of differential amplifier 14. Conversion portion 12 simply takes one of the two output voltages and buffers the selected output voltage to provide a single output voltage. Resistors 22, 24, 25 and 26 are gain setting resistors. For purposes of discussion only, assume that resistors 22 and 24-26 all have equal resistive values although it should be clear that any resistive values may be used depending upon a desired voltage gain. Conversion portion 12 is an unconventional amplifier structure which functions to cancel voltage error created by nonlinear variation in resistance with respect to voltage which is inherent with diffused resistors. Diffused resistors are formed by a diffused region in a substrate or a well region. The voltage differential which exists between the ends of the diffused area with respect to the substrate voltage potential is the voltage present on a diffused resistor. In order for two diffusion resistors to resistively match, each resistor must have the same voltage differential between respective ends with respect to the same substrate voltage potential. As the voltage potential between the substrate and the resistor increases, the junction between the diffusion and substrate reverse biases and the resistive value of the diffusion resistor decreases nonlinearly. Therefore, diffused resistors are nonlinear with respect to signal voltage variation.

Since resistors 22, 24, 25 and 26 are assumed to be equal valued resistors, it can be readily shown that the voltage gain of conversion portion 12 is one. The same voltage differential between ends of diffusion with respect to substrate potential exists for resistors 24 and 26. Another voltage differential between ends of diffusion with respect to substrate potential exists for resistors 22 and 25. Because of the symmetrical resistive structure of conversion portion 12, variations in resistive values of resistors 22, 24, 25 and 26 are substantially cancelled. However, the nonlinear variation in resistance caused by unequal voltages on resistors 17 and 19 are not compensated by conversion portion 12.

In one type of diffused resistor, a p− conductivity region is diffused into an n type substrate. Such a diffused resistor is commonly known as a "p−" resistor. Although p− resistors are nonlinearly variable with varying applied voltages, the p− resistors have important advantages in certain applications. P− resistors are easily integrated with transistor circuitry and are commonly used in a p well CMOS process because of a substantial savings in size which may be realized as compared with using other integrated resistors such as polysilicon resistors. It should be readily understood that n− resistors in an n well CMOS process may be readily fabricated and the same comments made with respect to p− resistors are applicable. However, the nonlinearity in resistance of either resistor type introduces a substantial second harmonic distortion component into the output signal. Therefore, circuit 10 provides a conversion from two outputs to a single output but has distortion in the output due to the nonlinearity of resistors 17 and 19 inherent from a p−resistor.

Figure 2:
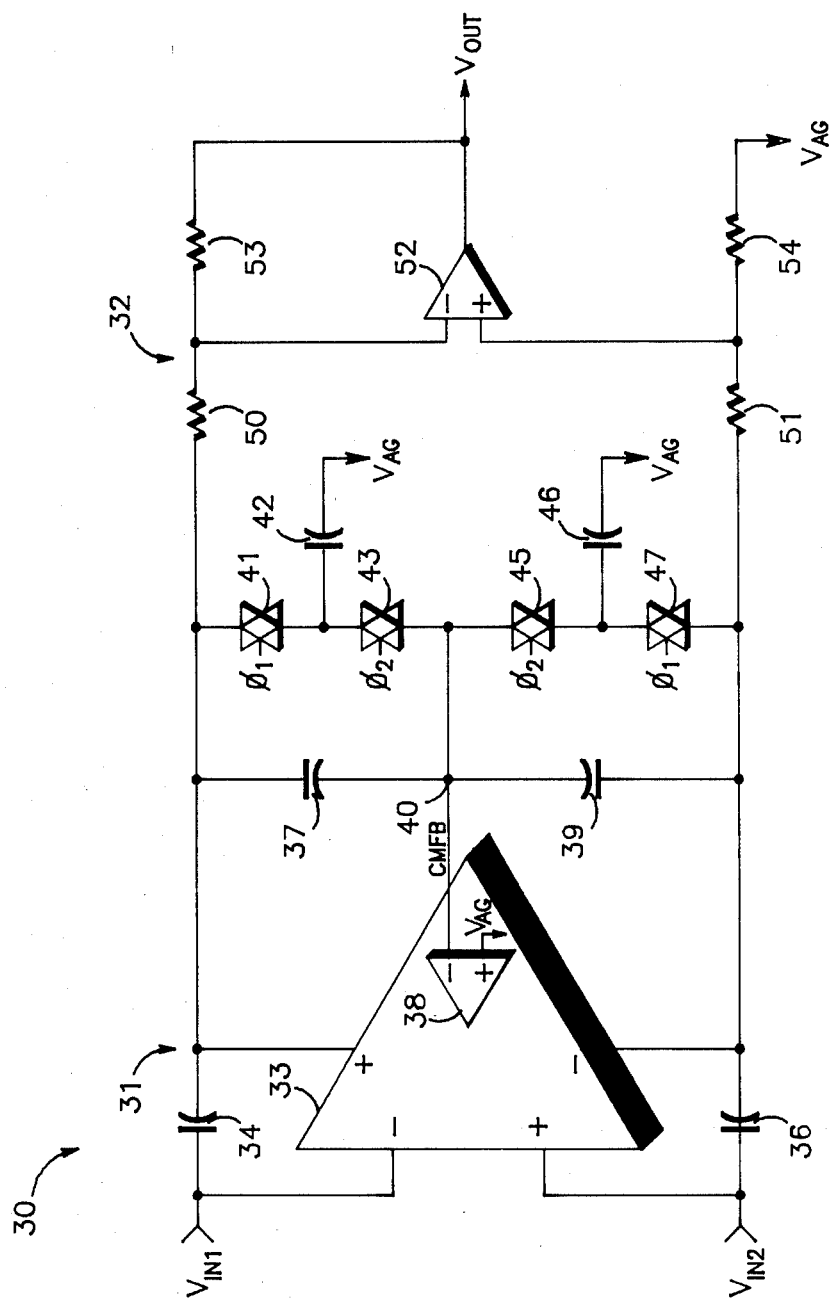
FIG. 2 illustrates in partial schematic form another circuit for converting differential amplifier outputs to a single output.

Shown in FIG. 2 is a circuit 30 which also converts a fully differential amplifier to a single-ended output. Circuit 30 has a fully differential amplifier portion 31 and a single output conversion portion 32. In amplifier portion 31, a fully differential amplifier 33 has a negative input for receiving a first input voltage "$V_{IN1}$" and a positive input for receiving a second input voltage "$V_{IN2}$". A first electrode of a feedback capacitor 34 is connected to the negative input of fully differential amplifier 33. A second electrode of capacitor 34 is connected to a positive output of differential amplifier 33. Differential amplifier 33 has a positive input for receiving a second input voltage "$V_{IN2}$" which is also connected to a first electrode of a feedback capacitor 36. A second electrode of capacitor 36 is connected to a negative output of differential amplifier 33. A first electrode of a common-mode feedback capacitor 37 is connected to the positive output of fully differential amplifier 33, and a second electrode of capacitor 37 is connected to a negative input of a commonmode feedback amplifier 38. A positive input of amplifier 38 is connected to analog ground $V_{AG}$. A first electrode of a common-mode feedback capacitor 39 is connected to the negative output of fully differential amplifier 33, and a second electrode of capacitor 39 is connected to the negative input of feedback amplifier 38 at a node 40. A switch 41 has a first terminal connected to the positive output of fully differential amplifier 33 and has a second terminal connected to both a first electrode of a capacitor 42 and a first terminal of a switch 43. A second electrode of capacitor 42 is connected to analog ground $V_{AG}$. A second terminal of switch 43 is connected to a first terminal of a switch 45 at node 40. A second terminal of switch 45 is connected to both a first electrode of a capacitor 46 and a first terminal of a switch 47. A second electrode of capacitor 46 is connected to analog ground $V_{AG}$. A second terminal of switch 47 is connected to the negative output of fully differential amplifier 33. A control signal labeled "$\phi_1$" is coupled to a control terminal of switches 41 and 47, and a control signal labeled "$\phi_2$" is coupled to a control terminal of switches 43 and 45.

Conversion portion 32 has a resistor 50 with a first terminal connected to the positive output of fully differential amplifier 33 and has a resistor 51 with a first terminal connected to the negative output of fully differential amplifier 33. A second terminal of resistor 50 is connected to a negative input of a single-ended output differential amplifier 52. A second terminal of resistor 51 is connected to a positive input of differential amplifier 52. A first terminal of a resistor 53 is connected to the negative input of differential amplifier 52, and a second terminal of resistor 53 is connected to an output of differential amplifier 52 for providing an output voltage $V_{OUT}$. A first terminal of a resistor 54 is connected to the positive input of differential amplifier 52, and a second terminal of resistor 54 is connected to analog ground $V_{AG}$.

In operation, circuit 30 functions to perform a differential output to single-ended output conversion without using P− resistors in the common-mode feedback path. Fully differential amplifier 31 uses substantially equal valued capacitors 37 and 39 as a capacitive divider circuit to create a common-mode feedback signal at node 40. In addition, substantially equal valued capacitors 42 and 46 each have an electrode synchronously switched from a predetermined output of differential amplifier 33 to node 40. Control signals $\phi_1$ and $\phi_2$ are nonoverlapping clock signals. Capacitor 42 charges the positive output voltage with respect to $V_{AG}$ and couples an equivalent charge to node 40. Similarly, capacitor 46 charges the negative output voltage with respect to $V_{AG}$ and couples an equivalent charge to node 40. Node 40 is a summing node which provides a common-mode feedback signal. Common-mode feedback amplifier 38 maintains the common-mode output voltage of fully differential amplifier 33 at a predetermined reference value such as analog ground $V_{AG}$. Output conversion portion 32 has a voltage gain determined by the resistance of resistors 50, 51, 53 and 54. If resistors 50, 51, 53 and 54 are equal valued resistors, it can be readily shown that the voltage gain is unity.

In the illustrated form, it should be readily noted that both outputs from fully differential amplifier 33 are coupled to conversion portion 32. The reason for using both outputs is that if only one output is used in a switched capacitor common-mode feedback structure, power supply noise is not rejected very well. Since power supply noise affects both outputs equally, noise is not removed from the output unless one output is subtracted from another. However, resistors 50, 51, 53 and 54 introduce nonlinearity into the output because the voltages on the resistors are no longer equal. Assume that a voltage of $(-V_{IN}/2)$ is present at the first terminal of resistor 51 when a voltage of $(+V_{IN}/2)$ is present at the first terminal of resistor 50. Assuming that the voltage between the first terminal of resistor 51 and $V_{AG}$ is equally divided between resistors 51 and 54, the positive input of differential amplifier 52 is at $(-V_{IN}/4)$. Therefore, assuming an ideal operational amplifier with infinite operational amplifier voltage gain, the voltage at the negative input of differential amplifier 52 is also at $(-V_{IN}/4)$. However, the second terminal of resistor 53 is connected to $V_{OUT}$, which equals $V_{IN}$. This means that none of resistors 50, 51, 53 and 54 have equal voltage differentials between the ends of each diffused region with respect to the substrate potential. The imbalance in voltage differential on resistors 50, 51, 53 and 54 introduces nonlinearity errors into the output voltage $V_{OUT}$. Therefore, although circuit 30 provides a single output while using a fully differential amplifier structure, the output is also somewhat inaccurate.

Figure 3:
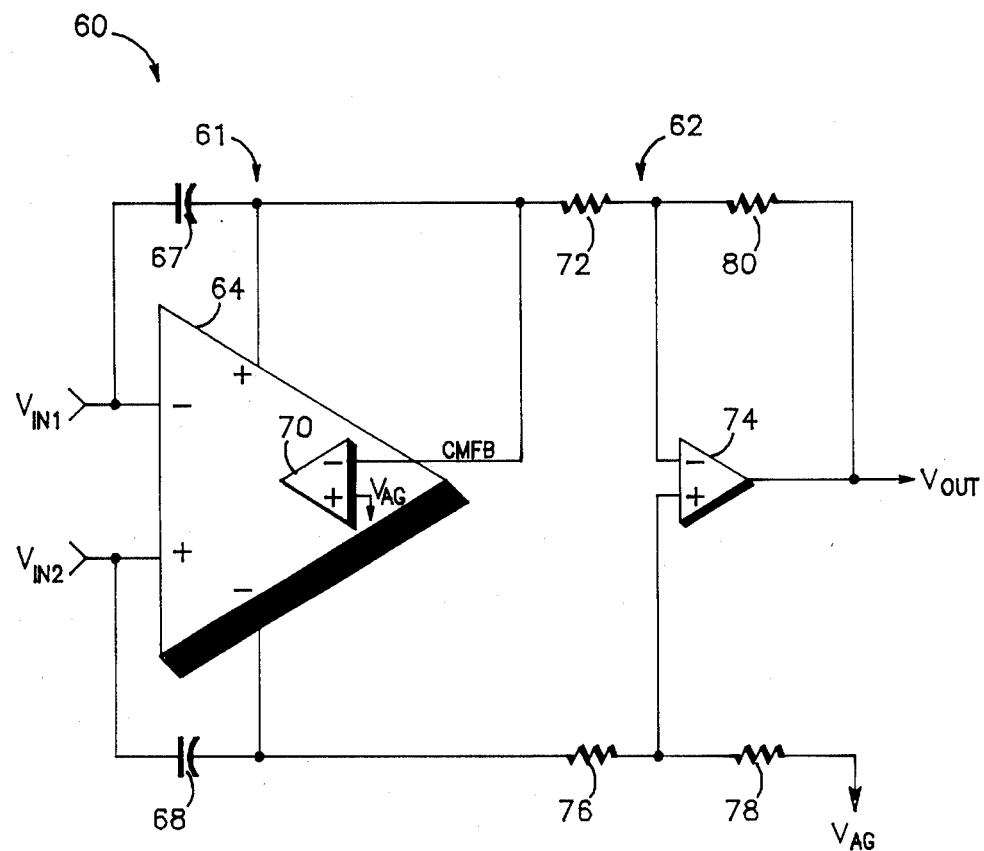
FIG. 3 illustrates in partial schematic form a circuit for converting differential amplifier outputs to a single output in accordance with the present invention.

Shown in FIG. 3 is a circuit 60 having a fully differential amplifier portion 61 and a single-ended conversion portion 62. Portion 61 has a fully differential amplifier 64 with positive and negative input and output terminals. The negative input of fully differential amplifier 64 is adapted to receive a first input voltage $V_{IN1}$, and the positive input of fully differential amplifier 64 is adapted to receive a second input voltage $V_{IN2}$. A feedback capacitor 67 has a first electrode connected to the negative input of differential amplifier 64 and a second electrode connected to the positive output of differential amplifier 64. A feedback capacitor 68 has a first electrode connected to the positive input of differential amplifier 64 and a second electrode connected to the negative output of differential amplifier 64. The positive output of fully differential amplifier 64 is connected to a negative input of a common-mode feedback amplifier 70. A positive input of feedback amplifier 70 is connected to analog ground $V_{AG}$. An output of feedback amplifier 70 provides a common-mode output voltage control signal to both positive and negative outputs of fully differential amplifier 64. As previously mentioned, a preferred implementation of a fully differential amplifier with common-mode feedback for use in the present invention is described in my copending allowed U.S. patent application Ser. No. 06/851,046.

Single-ended conversion portion 62 has a first terminal of a resistor 72 connected to the positive output of fully differential amplifier 64. A second terminal of resistor 72 is connected to a negative input of a single-ended output differential amplifier 74. A first terminal of a resistor 76 is connected to the negative output of fully differential amplifier 64. A second terminal of resistor 76 is connected to a positive input of differential amplifier 74. A resistor 78 has a first terminal connected to the second terminal of resistor 76 and a second terminal connected to analog ground $V_{AG}$. A resistor 80 has a first terminal connected to the second terminal of resistor 72 and a second terminal connected to an output of differential amplifier 74 for providing an output voltage $V_{OUT}$.

In operation, fully differential amplifier 64 provides positive and negative output voltages and has common-mode feedback. Differential amplifier 70 functions to maintain a predetermined common-mode output voltage, such as $V_{AG}$. However, in contrast to the differential to single-ended conversion performed by circuits 10 and 30, one of the outputs of fully differential amplifier 64 is used directly as a common-mode feedback signal. Differential feedback thru feedback capacitors 61 and 68 will force the negative output of fully differential amplifier 64 to the proper output voltage. It should be apparent that either one of the outputs of fully differential amplifier 64 may be used as the common-mode feedback signal depending upon the desired polarity of the output signal. The effect of connecting the positive output of differential amplifier 64 to the negative input of common-mode feedback amplifier 70 is to maintain the positive output at substantially $V_{AG}$. The effect of connecting the negative input of differential amplifier 70 to the positive output of fully differential amplifier 64 is equivalent to directly grounding the positive output at signal frequencies. Therefore, only a single output signal is passed from fully differential amplifier 64 thru resistor 76 to differential amplifier 74. However, power supply noise from fully differential amplifier 64 is present at both outputs and is coupled to differential amplifier 74 in a balanced manner thru resistors 72 and 76.

In the illustrated form, the voltage transfer function defining the voltage gain of differential amplifier 74 is the ratio of the output voltage divided by the voltage at the first terminal of resistor 76. It can readily be shown that the voltage gain of differential amplifier 74 is equal to the following product:

[R78/(R76+R78)][(R72+R80)/R72], where R78 symbolizes the resistance of resistor 78, etc.. In a preferred form, resistors 72, 76, 78 and 80 are all substantially equal valued resistors. Resistors 72 and 78 have equal voltage drops since the voltage at the first terminal of resistor 72 and the voltage at the second terminal of resistor 78 are the same and since the voltages at both inputs of differential amplifier 74 are equal. Similarly, the voltages on resistors 76 and 80 are substantially equal. Since these voltages are identical, the resistances of resistors 72, 78 and 76, 80 precisely match. If resistors 72, 76, 78 and 80 are implemented as p— resistors, nonlinearity errors created by reverse biasing from the substrate voltage are balanced and do not add an error term at the output of differential amplifier 74. Because the input to conversion portion 62 is fully differential, power supply noise is equally balanced. Noise present at the first terminal of resistor 76 is effectively subtracted at the first terminal of resistor 72. Excellent power supply rejection results while completely balancing nonlinearity errors associated in the fabrication of resistors 72, 76, 78 and 80 as p— resistors.

By now it should be apparent that a circuit having the advantages of a fully differential amplifier with a single output voltage has been provided. The present invention provides an output with excellent power supply rejection and may utilize space saving p— resistors without introducing resistor nonlinearity errors typically associated with such resistors. Although the invention has been discussed in the context of a single well CMOS technology, it should be apparent that the invention may be implemented using other types of semiconductor processes.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A circuit for converting first and second outputs of a fully differential amplifier to a single output, comprising:

common-mode output voltage control means coupled to the fully differential amplifier for maintaining a predetermined output common-mode voltage of the two outputs of the fully differential amplifier, said control means having a first input connected directly to a predetermined one of the first or second outputs of the fully differential amplifier and having a second input coupled to a reference voltage terminal, and an output for controlling the first and second outputs of the fully differential amplifier; and output buffer means coupled to the first and second outputs of the fully differential amplifier for providing the single output.

2. A circuit for converting first and second outputs of a fully differential amplifier to a single output, comprising:

common-mode output voltage control means coupled to the fully differential amplifier for maintaining a predetermined output common-mode voltage, said control means having a first input connected directly to a predetermined one of the first or second outputs of the fully differential amplifier and having a second input coupled to a reference voltage terminal;

a single-ended differential amplifier having first and second inputs and an output;

a first resistor having a first terminal coupled to the first output of the fully differential amplifier and a second terminal coupled to the first input of the single-ended differential amplifier;

a second resistor having a first terminal coupled to the second terminal of the first resistor, and a second terminal coupled to the output of the single-ended differential amplifier;

a third resistor having a first terminal coupled to the second output of the fully differential amplifier and a second terminal coupled to the second input of the single-ended differential amplifier; and a fourth resistor having a first terminal coupled to the second terminal of the third resistor, and a second terminal coupled to the reference voltage terminal.

3. The circuit of claim 2 wherein the first input of the single-ended differential amplifier is an inverting input and the second input of the single-ended differential amplifier is a noninverting input.

4. The circuit of claim 2 wherein the first, second, third and fourth resistors are each fabricated in integrated circuit form by diffusing a P conductivity type semiconductor material in an N conductivity type semiconductor material.

5. The circuit of claim 2 wherein the first, second, third and fourth resistors each have a substantially equal value of resistance.

6. The circuit of claim 2 wherein the first, second, third and fourth resistors are each fabricated in integrated circuit form by diffusing an N conductivity type semiconductor material in a P conductivity type semiconductor material.

7. A circuit which provides first and second outputs in response to receiving first and second input voltages and converts the first and second outputs to a single output, comprising:

a fully differential amplifier having a first input for receiving the first input voltage, a second input for receiving the second input voltage, and which provides the first and second outputs;

common-mode feedback means having a first input connected directly to the first output of the fully differential amplifier, a second input coupled to a reference voltage terminal, and an output for controlling both the first and second outputs of the fully differential amplifier for maintaining a predetermined common-mode output voltage;

a first resistor having a first terminal coupled to the first output of the fully differential amplifier, and a second terminal;

a second resistor having a first terminal coupled to the second output of the fully differential amplifier, and a second terminal;

a single-ended differential amplifier having a first input coupled to the second terminal of the first resistor, a second input coupled to the second terminal of the second resistor, and an output for providing the single output;

a third resistor having a first terminal coupled to the first input of the single-ended differential amplifier and a second terminal coupled to the output of the single-ended differential amplifier; and a fourth resistor having a first terminal coupled to the second input of the single-ended differential amplifier and a second terminal coupled to a reference voltage terminal.

8. The circuit of claim 7 wherein the first, second, third and fourth resistors have substantially equal values of resistance.

9. A method of converting first and second outputs of a fully differential amplifier to a single output, comprising the steps of:

coupling first and second input voltages to the fully differential amplifier;

controlling the common-mode output voltage of the two outputs of the fully differential amplifier with a common-mode feedback amplifier having a first input connected directly to the first output of the fully differential amplifier, a second input coupled to a reference voltage terminal, and an output for controlling the first and second outputs of the fully differential amplifier; and connecting unity gain buffer means directly to both the first and second outputs of the fully differential amplifier means for providing the single output.

* * * * *